United States Patent
Wu et al.

(10) Patent No.: US 11,948,805 B2
(45) Date of Patent: Apr. 2, 2024

(54) ETCHING METHOD, AIR-GAP DIELECTRIC LAYER, AND DYNAMIC RANDOM-ACCESS MEMORY

(71) Applicant: BEIJING NAURA MICROELECTRONICS EQUIPMENT CO., LTD., Beijing (CN)

(72) Inventors: Xin Wu, Beijing (CN); Chun Wang, Beijing (CN); Bo Zheng, Beijing (CN); Zhenguo Ma, Beijing (CN)

(73) Assignee: BEIJING NAURA MICROELECTRONICS EQUIPMENT CO., LTD., Beijing (CN)

( * ) Notice: Subject to any disclaimer, the term of this patent is extended or adjusted under 35 U.S.C. 154(b) by 65 days.

(21) Appl. No.: 17/769,841

(22) PCT Filed: Oct. 26, 2020

(86) PCT No.: PCT/CN2020/123648
§ 371 (c)(1),
(2) Date: Apr. 18, 2022

(87) PCT Pub. No.: WO2021/088670
PCT Pub. Date: May 14, 2021

(65) Prior Publication Data
US 2022/0375762 A1 Nov. 24, 2022

(30) Foreign Application Priority Data
Nov. 5, 2019 (CN) .......................... 201911073150.4

(51) Int. Cl.
*H01L 21/311* (2006.01)
*H01L 21/764* (2006.01)
*H10B 12/00* (2023.01)

(52) U.S. Cl.
CPC ...... *H01L 21/31116* (2013.01); *H01L 21/764* (2013.01); *H10B 12/01* (2023.02)

(58) Field of Classification Search
None
See application file for complete search history.

(56) References Cited

U.S. PATENT DOCUMENTS

| 11,205,577 B2 | 12/2021 | Watanabe et al. |
| 2004/0087179 A1 | 5/2004 | San et al. |

(Continued)

FOREIGN PATENT DOCUMENTS

| CN | 1378244 A | 11/2002 |
| CN | 101180722 A | 5/2008 |

(Continued)

OTHER PUBLICATIONS

The World Intellectual Property Organization (WIPO) International Search Report for PCT/CN2020/123648 dated Jan. 29, 2021 4 Pages (including translation).

*Primary Examiner* — Roberts P Culbert
(74) *Attorney, Agent, or Firm* — ANOVA LAW GROUP, PLLC (57) ABSTRACT

An etching method for selectively etching a silicon oxide film on a wafer surface that includes the silicon oxide film and a silicon nitride film includes: a surface layer removal process including: etching the silicon oxide film at a first etching rate and removing a surface modification layer covering on the silicon nitride film; and an etching process including: etching the silicon oxide film at a second etching rate. The first etching rate is smaller than the second etching rate.

18 Claims, 4 Drawing Sheets

(56) References Cited

U.S. PATENT DOCUMENTS

| | | | |
|---|---|---|---|
| 2013/0320550 A1* | 12/2013 | Kim | H01L 21/7682 257/773 |
| 2016/0093505 A1* | 3/2016 | Chen | H01J 37/32357 438/723 |
| 2017/0040180 A1 | 2/2017 | Xu et al. | |
| 2019/0013321 A1* | 1/2019 | Chang | H10B 12/485 |

FOREIGN PATENT DOCUMENTS

| | | | |
|---|---|---|---|
| CN | 102856191 A | 1/2013 |
| CN | 103456694 A | 12/2013 |
| CN | 104641455 A | 5/2015 |
| CN | 104851794 A | 8/2015 |
| CN | 105122432 A | 12/2015 |
| CN | 105390388 A | 3/2016 |
| CN | 105405867 A | 3/2016 |
| CN | 105914144 A | 8/2016 |
| CN | 106133883 A | 11/2016 |
| CN | 108352303 A | 7/2018 |
| CN | 108573861 A | 9/2018 |
| CN | 108885996 A | 11/2018 |
| CN | 109841572 A | 6/2019 |
| CN | 109962158 A | 7/2019 |
| CN | 110071040 A | 7/2019 |
| CN | 110993499 A | 4/2020 |
| JP | 1988099533 A | 4/1988 |
| JP | H11340332 A | 12/1999 |
| JP | 2003309108 A | 10/2003 |
| JP | 2003529935 A | 10/2003 |
| JP | 2006019442 A | 1/2006 |
| JP | 2006100503 A | 4/2006 |
| JP | 2006278836 A | 10/2006 |
| JP | 2010103497 A | 5/2010 |
| JP | 2010533378 A | 10/2010 |
| JP | 2011233878 A | 11/2011 |
| JP | 2015528647 A | 9/2015 |
| JP | 2016025111 A | 2/2016 |
| JP | 2017152531 A | 8/2017 |
| JP | 2017183509 A | 10/2017 |
| JP | 2018056280 A | 4/2018 |
| TW | 201519299 A | 5/2015 |
| TW | 201705265 A | 2/2017 |
| WO | 2019089766 A1 | 5/2019 |

* cited by examiner

ETCHING METHOD, AIR-GAP DIELECTRIC LAYER, AND DYNAMIC RANDOM-ACCESS MEMORY

CROSS-REFERENCE TO RELATED APPLICATIONS

This application is a national phase stage application of International Patent Application PCT/CN2020/123648, filed on Oct. 26, 2020, which claims priority to Chinese Patent Application No. 201911073150.4, filed on Nov. 5, 2019, the entire contents of all of which are incorporated herein by reference.

TECHNICAL FIELD

The present disclosure relates to the technical field of semiconductor manufacturing technologies and, more particularly, to an etching method for selectively etching a silicon oxide film, an air-gap dielectric layer, and a dynamic random-access memory.

BACKGROUND

As the feature size of integrated circuits continues to shrink, complexity of fabrication processes increases dramatically. In addition, due to the shrinking of line width sizes, it is necessary to develop a more precise and highly selective film removal process. For example, in an air-gap process of fabricating a dynamic radon-access memory (DRAM), a silicon oxide layer ($SiQ_2$) in a deep groove structure with an aspect ratio of 20:1 needs to removed completely without etching silicon nitride (SiN) on sidewalls of the deep grove structure, which requires an etching selectivity ratio of $SiO_2$/SiN above 100:1, preferably, 500:1 or even 1000:1.

For etching silicon nitride, one method is dry etching, which is derived from a conventional wet etching. The dry etching method uses chemical reaction gases and catalysts to chemically interact with a film layer directly, through a process integration control to remove bottom portions of holes and/or groves accurately and efficiently with no substrate damage (no plasma) and no re-oxidation. Another method uses a hydrogen fluoride (HF) gas supplemented by alcohols (e.g., methanol) or an alkaline gas (e.g., $NH_3$) to perform a catalytic etching, commonly known as methanol catalytic process or ammonia catalytic process. These two processes are also commonly used to etch silicon nitride.

However, it has been found from numerous experiments that, when using the existing methanol catalytic process, the etching selectivity ratio of $SiO_2$/SiN is basically at a level of 30:1; and when using the existing ammonia catalytic process, the etching selectivity ratio of $SiO_2$/SiN does not exceed 20:1. Neither of the two existing processes can satisfy a required etching selectivity ratio of $SiO_2$/SiN.

SUMMARY

To solve the above problems, the embodiments of the present disclosure provide an etching method, an air-gap dielectric layer, and a dynamic random-access memory, which provide improved etching selectivity ratio of $SiO_2$/SiN over the existing ammonia gas catalytic process.

One aspect of the present disclosure provides an etching method for selectively etching a silicon oxide film on a wafer surface that includes the silicon oxide film and a silicon nitride film. The etching method includes: a surface layer removal process including: etching the silicon oxide film at a first etching rate and removing a surface modification layer covering on the silicon nitride film; and an etching process including: etching the silicon oxide film at a second etching rate. The first etching rate is smaller than the second etching rate.

Optionally, the surface layer removal process includes: a first etching step including using an etching gas to etch the wafer surface at a first pre-determined pressure and within a first etching time length; a first purging step including using a purging gas to purge the wafer surface at a first purging pressure and within a first purging time length; and repeating the first etching step and the first purging step until the surface modification layer is removed.

Optionally, the etching process includes: a second etching step including using the etching gas to etch the silicon oxide film at a second pre-determined pressure and within a second etching time length; a second purging step including using the purging gas to purge the wafer surface at a second purging pressure and within a second purging time length; and repeating the second etching step and the second purging step until a target etching amount of the silicon oxide film is reached.

Optionally, the first pre-determined pressure is smaller than the second pre-determined pressure.

Optionally, the first pre-determined pressure is approximately between 1 Torr and 3 Torr; and the second pre-determined pressure is approximately between 5 Torr and 10 Torr.

Optionally, the first etching time length is smaller than the second etching time length.

Optionally, the first etching time length is approximately between 1 second and 3 seconds; and the second etching time length is approximately between 1 second and 5 seconds.

Optionally, the etching gas includes a first component gas and a second component gas; and the first component gas includes a hydrogen fluoride gas, and the second component gas includes an ammonia gas.

Optionally, the second purging step further includes using the second component gas to purge the wafer surface at the second purging pressure and within the second purging time length.

Optionally, the purging gas includes at least one of nitrogen ($N_2$) gas or an inert gas.

Optionally, in the surface layer removal process, the first component gas is supplied at a first flow rate; and in the etching process, the first component gas is supplied at a second flow rate, the first flow rate being greater than the second flow rate.

Optionally, a process temperature of both the surface layer removal process and the etching process is greater than or equal to 120° C.

Optionally, between the surface layer removal process and the etching process, the etching method further includes: performing a heating process and a sublimation process on the wafer; and after the sublimation process, cooling the wafer to a room temperature.

Optionally, a temperature of the sublimation process is greater than or equal to 180° C.

Optionally, before the etching process, the etching method further includes: removing and placing the sublimed and cooled wafer for standing still for a pre-determined time length.

Optionally, before the surface layer removal process, the etching method further includes: inspecting a thickness of the surface modification layer on the wafer surface to determine a number of repetitions of the first etching step and the first purging step.

Optionally, a total gas flow in the second etching step is same as a total gas flow in the second purging step.

Optionally, the surface modification layer includes at least three elements of silicon, nitrogen, and oxygen.

Another aspect of the present disclosure provides an air-gap dielectric layer. The air-gap dielectric layer is formed using the disclosed etching method.

Another aspect of the present disclosure provides a dynamic random-access memory. The dynamic random-access memory includes the disclosed air-gap dielectric layer.

The technical effects of the embodiments of the present disclosure include the following.

The etching method provided by the present disclosure divides the etching into two processes. At first, through removing the surface modification layer covering the surface of the silicon nitride film, a substantial degradation of an etching selectivity ratio of $SiO_2/SiN$ caused by the surface modification layer on the wafer surface can be avoided. In addition, through making the first etching rate smaller than the second etching rate, excessive etching can be avoided in the surface layer removal process, thereby further ensuring a high etching selectivity ratio. Then, in the etching process, a relatively high etching rate can ensure etching efficiency. The etching method provided by the present disclosure can also obtain the air-gap dielectric layer with a high etching selectivity ratio of $SiO_2/SiN$ and the dynamic random-access memory with a high performance.

BRIEF DESCRIPTION OF THE DRAWINGS

To more clearly illustrate the technical solution of the present disclosure or the technical solution in the prior art, the accompanying drawings used in the description of the disclosed embodiments are briefly described below. The drawings described below are merely some embodiments of the present disclosure. Other drawings may be derived from such drawings by a person with ordinary skill in the art without creative efforts and may be encompassed in the present disclosure.

Structures, proportions, sizes, etc. described in this specification are only used to support contents disclosed in the specification for the understanding and reading of those who are familiar with the technology, and are not used to limit conditions for implementing the present disclosure, hence provide no substantive technical meaning. Any modification of the structures, change of the proportional relationship or adjustment of the sizes should still fall within the scope of the present disclosure without affecting effects that the present disclosure can produce and objectives that can be achieved.

Description of reference characters includes: W—wafer, 11—silicon oxide film, 12—silicon nitride film, 13—oxidative modification layer, 210—etching process chamber, 220—even flow chamber, 230—gas distribution plate, 240—base, 311—HF gas source, 312—$N_2$ gas source, 313—$NH_3$ gas source, 321—first mass flow controller, 322—second mass flow controller, 323—third mass flow controller, 324—fourth mass flow controller, 331—first exchange point, 332—second exchange point, 333—third exchange point.

DETAILED DESCRIPTION OF THE EMBODIMENTS

The following specific embodiments are used to illustrate various features of the present disclosure. Those who are familiar with the technology can easily understand other advantages and effects of the present disclosure from contents disclosed in the specification. The embodiments described herein are some and not all embodiments of the present disclosure. Based on the embodiments of the present disclosure, other embodiments obtained by those of ordinary skill in the art without creative efforts shall fall within the protection scope of the present disclosure.

In the description of the present disclosure, terms, such as "first," "second," "third" may be used for descriptive purpose only, and should not be construed as indicating or implying relative importance. The embodiments of the present disclosure and features of the embodiments may be combined with each other under circumstances of no conflict. To make the objectives, features and advantages of the present disclosure more clearly understood, specific embodiments of the present disclosure will be described in detail below with reference to the accompanying drawings.

Figure 1:
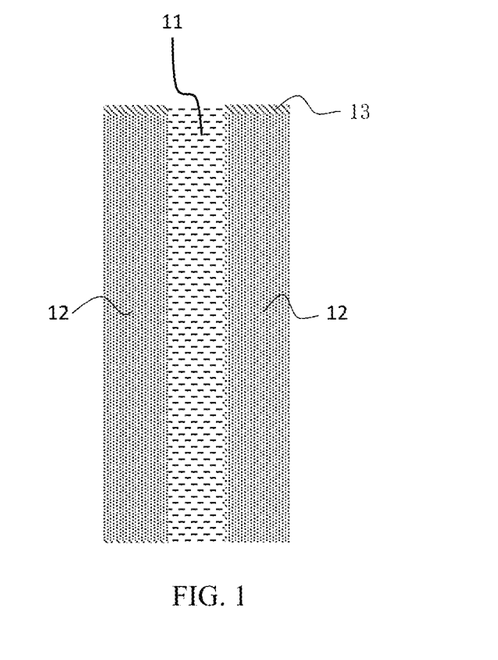
FIG. 1 is a schematic structural diagram of a deep groove etching structure according to some embodiments of the present disclosure.

One aspect of the present disclosure provides an etching method for selectively etching a silicon oxide film ($SiO_2$) on a surface of a to-be-processed wafer that includes the silicon oxide film ($SiO_2$) and a silicon nitride film (SiN). For example, as shown in FIG. 1, in the air-gap process of fabricating a dynamic radon-access memory (DRAM), the silicon oxide film ($SiO_2$) 11 in a deep groove structure with an aspect ratio of 20:1 needs to completely removed without etching the silicon nitride film (SiN) 12 on the sidewall of the deep groove.

Figure 2:
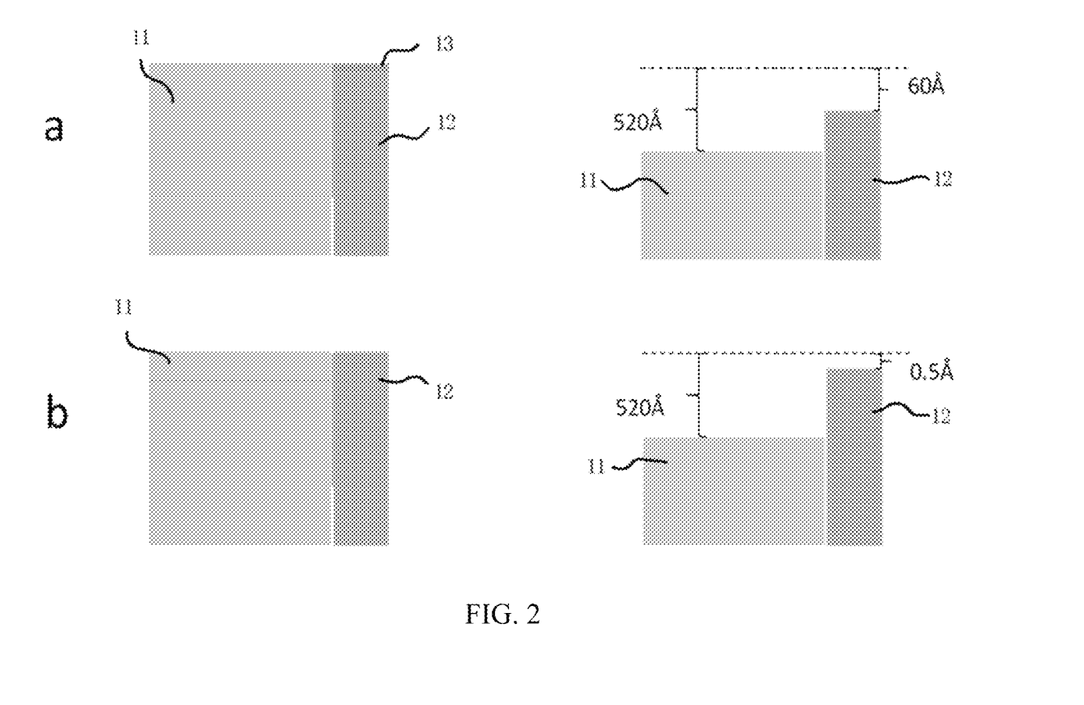
FIG. 2 is a schematic comparison diagram of etching a wafer with a surface oxidative degeneration layer and etching a wafer without the surface oxidative degeneration layer using a same etching process according to some embodiments of the present disclosure.

In actual fabrication process, due to explosion to atmosphere, a surface of the silicon nitride film 12 is oxidized and modified to form a surface modification layer 13 including at least three elements of silicon, nitrogen, and oxygen. The surface modification layer negatively affects the etching process. As shown in FIG. 2, two wafer samples a and b selected to perform a comparison experiment. The silicon nitride film 12 of the wafer sample a includes the surface modification layer 13 while the silicon nitride film 12 of the wafer sample b does not include the surface modification layer 13. After the wafer samples a and b are etched by a same etching process, an etching amount of $SiO_2$ and SiN on each wafer sample is measured. It is found that the etching amount of the silicon nitride film 12 of the wafer sample a is substantially greater than the etching amount of the silicon nitride film 12 of the wafer sample b. The specific comparison measurements are shown in Table 1 below.

TABLE 1

| Wafer sample | Etching amount of $SiO_2$ | Etching amount of SiN | Etching selectivity ratio of $SiO_2$/SiN |
| --- | --- | --- | --- |
| a: with the surface modification layer | −520 Å | −60 Å | 8.7 |
| b: without the surface modification layer | −520 Å | −0.5 Å | 1040.0 |

As can be seen from Table 1 above, the presence of the surface modification layer 13 affects absorption of an etching gas, causing a sudden increase in the etching amount of SiN. In addition, when the surface modification layer 13 is etched, solid byproducts produced under the silicon nitride film cause further etching.

Based on the above findings, to avoid degradation of the etching selectivity ratio of $SiO_2$/SiN caused by the surface modification layer, the etching method provided by the present disclosure divides the etching into two processes, which include a surface layer removal process and an etching process. At the surface layer removal process, the silicon oxide film is etched at a first etching rate, and the surface modification layer covering the surface of the silicon nitride film is removed. At the etching process, the silicon oxide film is etched at a second etching rate. The first etching rate is smaller than the second etching rate.

Through removing the surface modification layer covering the surface of the silicon nitride film, the substantial degradation of the etching selectivity ratio of $SiO_2$/SiN caused by the surface modification layer can be avoided. Through making the first etching rate smaller than the second etching rate, excessive etching can be avoided in the surface layer removal process, thereby further ensuring a high etching selectivity ratio. At the same time, in the etching process, a relatively high etching rate can ensure etching efficiency.

The etching gas mainly includes a first component gas and a second component gas. In some embodiments, the first component gas includes a hydrogen fluoride gas (HF), and the second component gas includes an ammonia gas ($NH_3$). The etching gas combination has a higher etching efficiency.

Specifically, in one embodiment, the above surface layer removal process specifically includes a first etching step and a first purging step. In the first etching step, an etching gas is used to etch the surface of the wafer within a first pre-determined pressure and a first etching time length. In the first purging step, a purging gas is used to purge the wafer within a first purging pressure and a first purging time length. The first etching step and the first purging step are repeated until the surface modification layer is removed.

The etching gas mainly includes a first component gas and a second component gas. In some embodiments, the first component gas includes a hydrogen fluoride gas (HF), and the second component gas includes an ammonia gas ($NH_3$). The etching gas combination has a higher etching efficiency.

The purging gas mainly includes at least one of nitrogen ($N_2$) gas or an inert gas. The inert gas includes, but is not limited to, helium, neon, argon, and the like.

The above surface layer removal process uses the following typical process parameters.

In the first etching step, the first pre-determined pressure is about 2.2 Torr. The etching gas includes $N_2$, HF, and $NH_3$. The $N_2$ gas has a flow rate of about 450 sccm. The HF gas has a flow rate of about 300 sccm. The $NH_3$ gas has a flow rate of about 100 sccm. The first etching time length is about 2 seconds. An etching process temperature is about 120° C.

In the first purging step, the first purging pressure is about 6 Torr. The purging gas includes $N_2$. The $N_2$ gas has a flow rate of about 2700 sccm. The first purging time length is about 2 seconds. A purging process temperature is about 120° C.

The first etching step and the first purging step are performed repeatedly. A number of repetitions depends on a target etching amount of the SiN surface modification layer. For example, if the target etching amount is about 5 Å, the number of repetitions is about 30 times. A setting of the above target etching amount is related to a thickness of the SiN surface modification layer, which is generally between 1 Å and 10 Å. The thickness of the SiN surface modification layer varies when grown in different ways.

Optionally, in the first etching step, the flow rate of the HF gas is relatively high while the flow rate of the $NH_3$ gas is relatively low, such that a volume proportion of the HF gas is higher than a volume proportion of the $NH_3$ gas in a process chamber. To a certain extent, this suppresses a combined etching rate of the HF gas and the $NH_3$ gas, thereby avoiding over-etching. The first pre-determined pressure in the surface layer removal process is approximately between 1 Torr and 3 Torr, preferably 2 Torr. Through setting the first pre-determined pressure in a low range, it is beneficial to further suppress the etching rate. The first etching time length in the surface layer removal process is approximately between 1 second and 3 seconds, preferably 2 second. Through setting the first etching time length in a short range, it is beneficial to precisely control the etching amount and to slow down the etching rate.

In the first purging step, the first purging time length is not shorter than the first etching time length, such that etching reactants and byproducts can be sufficiently purged. In addition, to slow down the etching rate, no $NH_3$ gas is introduced in the first purging step to prevent presoak from occurring. Thus, a time length required for the etching gas to be combined and absorbed on the surface of the wafer can be extended to slow down the etching rate, and the surface modification layer on the silicon nitride film can be removed under the premise of avoiding excessive etching of SiN.

In some embodiments, the following method of passing gases may be used in the above surface layer removal process.

1) At a first moment, a certain amount of the $N_2$ gas (e.g., 450 sccm) is passed into the chamber, such that the pressure in the chamber reaches the first pre-determined pressure (e.g., 2.2 Torr).

2) At a second moment, while the pressure in the chamber is kept unchanged, a certain amount of the $NH_3$ gas (e.g., 100 sccm) and a certain amount of the HF gas (e.g., 300 sccm) are passed simultaneously into the chamber, to start an etching reaction, that is, the first etching step.

3) At a third moment, a flow of the $NH_3$ gas and the HF gas is stopped, the first etching step ends, and the first purging step starts. At this point, the $N_2$ gas continues to be passed into the chamber to remove the etching reactants and byproducts.

4) Repetitively, through supplying the flow of the $NH_3$ gas and the HF gas in the form of pulses, the surface layer removal process is repeated multiple times between the etching step and the purging step to remove the surface modification layer.

5) The first etching time length in the first etching step is shorter than an etching incubation time length of SiN under process conditions.

Figure 3:
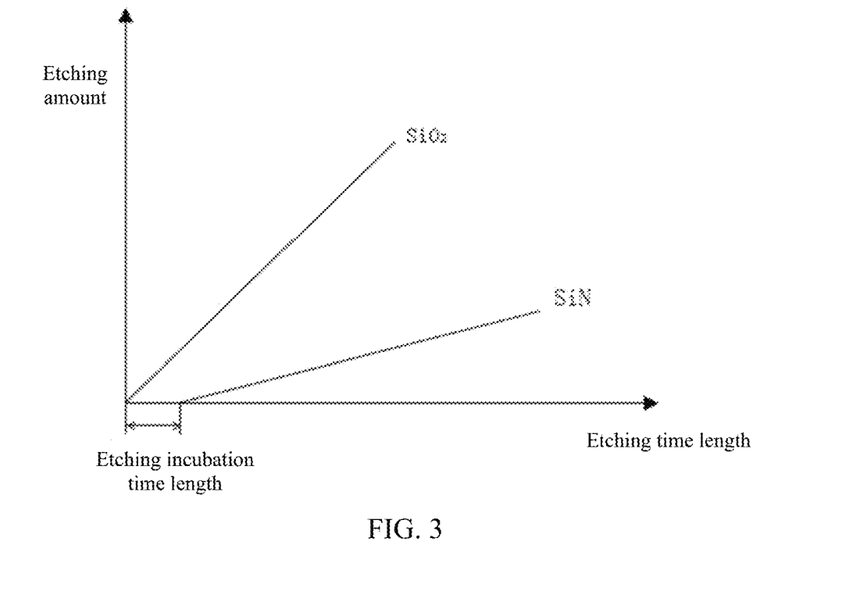
FIG. 3 is a schematic comparison diagram between an etching incubation time of $SiO_2$ and an etching incubation time of SiN according to some embodiments of the present disclosure.
Figure 4:
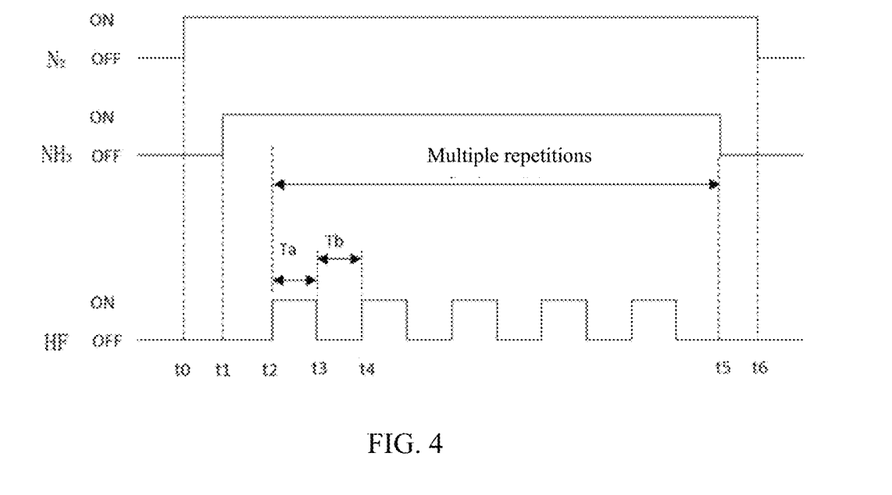
FIG. 4 is a schematic diagram of a timing sequence of etching gas introduction according to some embodiments of the present disclosure.

As shown in FIG. 3, a horizontal coordinate is the etching time, and the vertical coordinate is the etching amount. The etching gas does not have an etching reaction as soon as it reaches the surface of the wafer. Instead, the etching gas needs to be incubated for a certain time length, that is, the etching incubation time length. Exceeding the etching incubation time of SiN may cause etching of SiN and affect improvement of the etching selectivity ratio. At the same time, the first purging time length in the first purging step is not shorter than the first etching time length, which can avoid over-etching and provide sufficient purging time length to quickly remove the etching gas and avoid having residual etching gas for staying too long.

In one embodiment, the above etching step specifically includes: a second etching step and a second purging step. In the second etching step, the etching gas is used to selectively etch the silicon oxide film within a second pre-determined pressure and a second etching time length. In the second purging step, the purging gas is used to purge the surface of the wafer within a second purging pressure and a second purging time length. The above second etching step and second purging step are performed repeatedly until the target etching amount of the silicon oxide film is reached.

The etching gas mainly includes the first component gas and the second component gas. In some embodiments, the first component gas includes the hydrogen fluoride gas (HF), and the second component gas includes the ammonia gas ($NH_3$). The etching gas combination has the higher etching efficiency.

The purging gas mainly includes at least one of the nitrogen $N_2$ gas or the inert gas. The inert gas includes, but is not limited to, helium, neon, argon, and the like.

The above etching step uses the following typical process parameters.

In the second etching step, the second pre-determined pressure is about 8 Torr. The etching gas includes $N_2$, HF, and $NH_3$. The $N_2$ gas has a flow rate of about 450 sccm. The HF gas has a flow rate of about 20 sccm. The $NH_3$ gas has a flow rate of about 100 sccm. The second etching time length is about 3 seconds. The etching process temperature is about 120° C.

In the second purging step, the second purging pressure is about 8 Torr. The purging gas includes $N_2$. The $N_2$ gas has a flow rate of about 470 sccm. The $NH_3$ gas has a flow rate of about 100 sccm. The second purging time length is about 6 seconds. The purging process temperature is about 120° C.

The second etching step and the second purging step are performed repeatedly. The number of repetitions depends on the target etching amount of $SiO_2$ surface modification layer.

Optionally, in the second etching step, the flow rate of the HF gas is relatively low while the flow rate of the $NH_3$ gas is relatively high, such that the volume proportion of the HF gas is lower than the volume proportion of the $NH_3$ gas in the process chamber. To a certain extent, this increases the etching rate. Particularly, the flow rate of the HF gas used in the second etching step is smaller than the flow rate of the HF gas used in the first etching step, such that a second etching rate in the second etching step is greater than a first etching rate in the first etching step.

In the second purging step, the second pre-determined pressure is approximately between 5 Torr and 10 Torr, preferably 8 Torr. Through setting the second pre-determined pressure in a high range, it is beneficial to further expedite the etching rate.

In the second purging step, the second etching time length is approximately between 1 second and 5 seconds. Through setting the second etching time length in a long range, it is beneficial to allow sufficient immersion reaction of the etching gas on the wafer surface. On the other hand, to avoid over-etching of SiN caused by allowing a single-step etching time length to approach the etching incubation time length of SiN, the second etching time length is preferably about 3 second. During the etching incubation time of SiN, the second etching step does not substantially etch SiN.

In the second purging step, the second purging time length is not shorter than the second etching time length, such that etching reactants and byproducts can be sufficiently purged. Optionally, supply of the $NH_3$ gas continues in the second purging step, that is, the purging gas in the second purging step further includes the $NH_3$ gas supplied at the same flow rate as in the second etching step. The continuously supplied $NH_3$ gas sufficiently immerges the wafer surface, such that the wafer surface absorbs sufficient amount of the $NH_3$ gas in advance before a subsequent etching step. Thus, when the HF gas is introduced, a time length for gas mixing and adhesion to the wafer surface for the etching reaction is shortened, which in turn expedites an etching gas reaction rate in the subsequent etching step, thereby improving the etching efficiency.

Optionally, a total gas flow in the second etching step is the same as a total gas flow in the second purging step, such that the flow rate remains unchanged. A butterfly valve used to control the flow of the chamber does not need to be switched frequently. Thus, an operation of the etching process is simplified and stability and accuracy of an etching system are improved.

Embodiment 1 provides experimental comparison of the $SiO_2$/SiN selectivity ratio of different etching process steps. It can be seen from the comparison table that after adding the surface layer removal process, the etching selectivity ratio is substantially improved.

Further, when performing the etching step, each single-step etching time length cannot be too long. Otherwise, once the etching amount of SiN increases, the etching selectivity ratio will be difficult to improve. For this reason, it is necessary to divide the entire etching step into multiple single-step etching time lengths. An ending point of each single-step etching time length is a starting point of etching SiN. That is, each single-step etching time length is the etching incubation time length of SiN. The etching gas does not have an etching reaction as soon as it reaches the surface of the wafer. Instead, the etching gas needs to be incubated for a certain time length, that is, the etching incubation time length. In general, the faster the etching rate, the shorter the incubation time length. As shown in FIG. 3, because the etching rate of $SiO_2$ is faster than the etching rate of SiN, there is a time difference between the incubation time lengths of the two. The etching performed within the time difference can achieve a relatively high etching selectivity ratio.

Therefore, in some embodiments, the following method of passing gases may be used in the above etching step.

1) At t0, a certain amount of the $N_2$ gas (e.g., 450 sccm) is passed into the chamber, such that the pressure in the chamber reaches a pre-determined pressure (e.g., 8 Torr).

2) At t1, while the pressure in the chamber is kept unchanged, a certain amount of the $NH_3$ gas (e.g., 100 sccm) is passed into the chamber, to allow the wafer surface to absorb a sufficient amount of the $NH_3$ gas in advance, that is, the $NH_3$ gas presoak.

3) At t2, while the pressure in the chamber continues to be kept unchanged, a flow of the HF gas is passed into the chamber, that is, the second etching step. At t3, the flow of the HF gas is stopped, the second etching step ends and the second purging step starts. At this time, the $NH_3$ gas and the $N_2$ gas continued to be supplied to facilitate a timely removal of the etching reactants. At the same time, a continuous supply of the $NH_3$ gas is beneficial to presoaking the wafer surface in advance.

4) Repetitively, through supplying the flow of the HF gas in the form of pulses, the etching process is repeated multiple times between the etching step and the purging step to persistently etch $SiO_2$.

5) The second etching time length in the second etching step is shorter than an etching incubation time length of SiN under the process conditions. The second purging time length Tb in the second purging step is not shorter than the second etching time length Ta in the second etching step, such that over-etching can be avoided and a sufficient purging time length is provided to quickly remove the etching gas. Thus, the residual etching gas is prevented from staying for too long to exceed the etching incubation time lengths of SiN, thereby causing the etching of SiN, and affecting the improvement of the etching selectivity ratio.

In the second purging step, the $NH_3$ gas continues to be supplied. The continuously supplied $NH_3$ gas sufficiently immerges the wafer surface, such that the wafer surface absorbs sufficient amount of the $NH_3$ gas in advance before the subsequent etching step. Thus, when the HF gas is introduced, the time length for gas mixing and adhesion to the wafer surface for the etching reaction is shortened, which in turn expedites the etching gas reaction rate in the subsequent etching step, thereby improving the etching efficiency.

Therefore, under the condition that SiN is ensured not to be etched in each single-step etching time length, a process window is extended to maximize the etching of $SiO_2$. Through multiple repetitions of etching, a relatively high etching selectivity ratio of $SiO_2$/SiN is eventually achieved.

In the above sequence of passing gases, in the second etching step and the second purging step, the $NH_3$ gas is continuously supplied while the HF gas is supplied in the form of pulses. In some embodiments, the two gases may be switched. That is, the HF gas is continuously supplied while the $NH_3$ gas is supplied in the form of pulses. Through optimizing the process parameters, a desired etching incubation time length can be obtained and a high etching selectivity ratio can be achieved. This is because, in absence of $NH_3$ catalyst, the HF gas does not etch $SiO_2$ or SiN.

Figure 5:
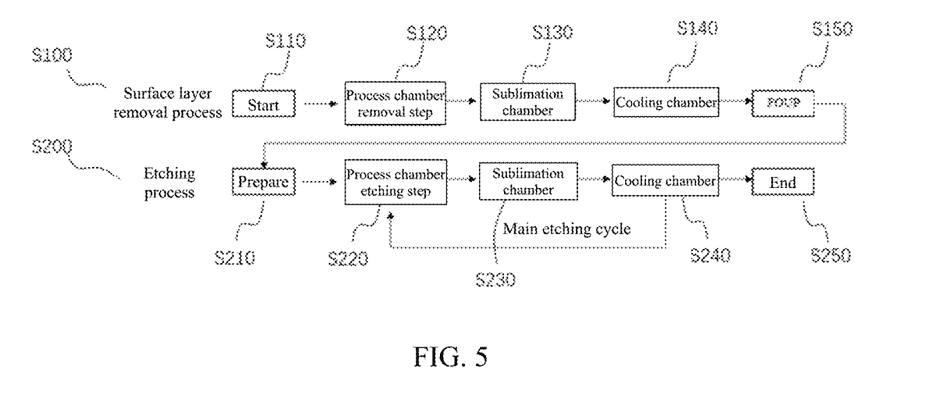
FIG. 5 is a flowchart of an etching process according to some embodiments of the present disclosure.

In some embodiments, the etching reactants are deposited on the wafer surface. It is difficult for the absorbed etching gas to be purged completely, resulting in accelerated etching of the silicon nitride film. The etching reactants and byproducts deposited on the silicon oxide film partially prevent the etching gas from directly reacting with the $SiO_2$ in contact, and slow down the etching rate of $SiO_2$. Thus, on one hand, SiN is excessively etched. On the other hand, $SiO_2$ is insufficiently etched. As a result, the etching selectivity ratio is reduced. Therefore, in the entire etching process, the surface layer removal process and the etching process are completely separated. As shown in FIG. 5, after the surface layer removal process, the wafer W is moved out of the etching system and enters a front opening unified pod (FOUP). Then, the etching process starts over again. Whether the etching process needs to perform multiple cycles of etching depends on the actual requirements. An objective of performing multiple cycles of etching is to fully sublime and discharge the etching reactants and byproducts. Because suppression of the etching rate of $SiO_2$ by the etching reactants and byproducts is eliminated, increasing the number of cycles of etching can increase the etching amount of $SiO_2$. A temperature of sublimation process is greater than or equal to about 180° C. to ensure sufficient sublimation and discharge of the etching reactants and byproducts remained on the wafer surface.

Specifically, as shown in FIG. 5, the etching process includes the surface layer removal process S100 and the etching process S200. The surface layer removal process S100 includes preparing for the surface layer removal (S110), feeding the wafer W into an etching chamber for the surface layer removal (S120), removing the wafer W from the etching process chamber and placing the wafer W in a sublimation chamber to be heated and sublimed to discharge the etching reactants and byproducts on the surface of the wafer W (S130), removing the wafer W after the etching reactants and byproducts are completely removed and placing the wafer W in a cooling chamber for cooling (S140), and placing the wafer W in the FOUP and letting it stand still for a few minutes or letting the wafer W stand still for a few minutes in a vacuum chamber before performing the etching process S200 (S150).

The wafer W stands for less than five minutes. As such, after the wafer W is removed from the cooling chamber and stands still for a certain time, some reactants or etching gases freely existed over the surface of the wafer W are volatilized and separated from the surface of the wafer W. In addition, separation from the environment of freely existed components remained in the cooling chamber facilitates complete volatilization and purification of the residuals and etching gases on the surface of the wafer W. Standing still for a certain time offsets chemical reaction stress between atoms on a SiN surface, regularizes the atomic structure arrangement, improves a surface flatness, and reduces an area of the SiN surface for absorbing and contacting the etching gas. At the same time, the standing still environment may be in the FOUP or the vacuum chamber. Because SiN is unlikely to be oxidized when being exposed at the room temperature for a short time length, the cooled wafer W can stand still for a few minutes in the FOUP without being oxidized to form the surface modification layer again.

The etching process S200 sequentially includes: preparing for etching (S210), feeding the wafer W into the etching chamber for etching (S220), removing the wafer W from the etching chamber and placing the wafer W in the sublimation chamber to be heated and sublimed to discharge the etching reactants on the surface of the wafer W (S230), and removing the wafer W after the etching reactants are completely removed and placing the wafer W in the cooling chamber (S240). At S250, S220 to S240 are repeated until the silicon oxide film etching amount satisfies the target etching amount, and the wafer W is placed in the FOUP.

Compared with directly subliming and purging in the etching chamber, repeating S220 to S240 further facilitates to completely sublime and discharge the etching reactants, such that the etching reactants on the surface of the wafer W can be completely removed. Thus, reduction of the etching rate and the etching selectivity ratio of SiO$_2$/SiN caused by the deposition of the etching reactants can be avoided.

Figure 6:
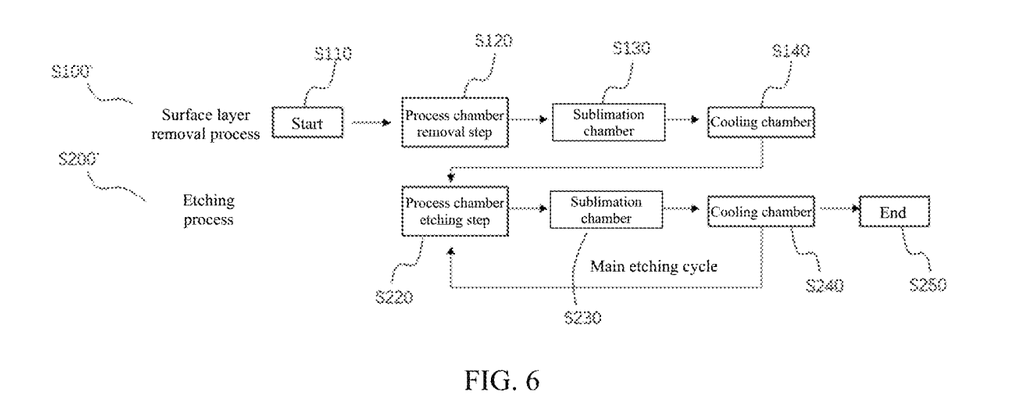
FIG. 6 is a flowchart of another etching process according to some embodiments of the present disclosure.

In some embodiments, the above steps may be simplified. As shown in FIG. 6, the surface layer removal process S100' is performed in conjunction with the etching process S200'. After S120, the wafer W is sublimed (S130) and cooled (S140), and then the etching process S200' is performed directly without exiting the etching chamber or being placed in the FOUP. In this case, it is necessary to enhance S130 of the surface layer removal process 100' to ensure that the etching reactants and byproducts are completely removed. Otherwise, the etching of SiN will be affected.

Embodiment 2 provides the experimental comparison of the SiO$_2$/SiN selectivity ratio of different etching process steps. It can be seen that the surface layer removal process and the etching process are performed separately, that is, after S140, the cooled wafer W is removed from the etching system and then is placed in the FOUP or the vacuum chamber for standing still for a few minutes. Compared with directly performing the etching process 200 on the cooled wafer W after S140, the etching selectivity ratio is substantially improved.

In some embodiments, to precisely control a thickness of the surface modification layer on the wafer W, the number of etching cycles and the time length for each etching cycle need to be precisely controlled. At S110 of the surface layer removal process, the thickness of the surface modification layer on the wafer is inspected first. Based on the thickness of the surface modification layer, the number of etching cycles for the surface layer removal process is determined. Thus, the surface layer removal process can be performed in a targeted manner to ensure that the surface modification layer is completely removed and at the same time, excessive etching is avoided.

Particularly, when the thickness of the surface modification layer is detected to be zero, the number of etching cycles of the surface layer removal process is determined to be zero. That is, S120 through S150 of the surface layer removal process are skipped, and the etching process 200 is performed directly. Thus, while ensuring that no surface modification layer affects the etching selectivity ratio, the etching process is simplified and the etching efficiency is improved.

In some embodiments, S210 includes a re-inspection of the thickness of the surface modification layer on the surface of the wafer W to ensure that before performing S220, no surface modification layer (or oxidation layer) exists on the surface of the wafer W. Thus, the high etching selectivity ratio can be achieved.

In some embodiments, the etching reaction and the sublimation of solid etching reactants occur in a same chamber. That is, the etching amount is increased through increasing the number of etching and purging cycles. In actual practices, only the number of cycles in an automated process recipe is increased. The wafer needs not to be swapped in and out of the process chamber frequently. Alternatively, the above two processes may be performed separately in the etching chamber and the sublimation chamber. In actual practices, the wafer needs to be moved repeatedly between the two chambers. In addition, the above two methods may be combined. A separate chamber process is beneficial for removing the wafer from the original reaction environment, avoiding secondary deposition of the freely existed etching gas and etching reactants on the wafer surface and suppression of sublimation and discharge of the above components on the wafer surface.

In some embodiments, the etching parameters are optimized to reduce the pressure of the supplied etching gas and proportion of the NH$_3$ gas. Thus, after an initial etching rate of the etching process is reduced, the etching parameters may also be applied to the surface layer removal process.

In some embodiments, under the condition that each single-step etching time length of the etching process is not shorter than the etching incubation time length of SiO$_2$ film, the single-step etching time length is closer to the etching incubation time length of SiO$_2$ film relative to the etching incubation time length of SiN film, thereby ensuring the high etching selectivity ratio of SiO$_2$/SiN. That is, the etching incubation time length of SiO$_2$ film 23 the first etching time length<the second etching time length<<the etching incubation time length of SiN film.

As shown in Embodiment 3, under the condition that each single-step etching time length is not shorter than the etching incubation time length of SiO$_2$ film, the single-step etching time length that is substantially shorter than the incubation time length of SiN further avoids a time extension approaching or even exceeding the etching incubation time length of SiN due to untimely and insufficient purging of the etching gas and etching reactants deposited on the surface of the wafer W. Thus, the shorter each single-step etching time length, the more time available for each purging time length. When the etching incubation time length of SiN film is approached or exceeded, the etching gas and the etching reactants are completely removed to avoid etching the SiN film. In addition, a long single-step etching time length will cause the etching reactants to adhere and deposit excessively on the surface of the wafer W, making it difficult to sublime, purge, and remove completely, thereby further absorbing the etching gas and causing the SiN film to be etched. As such, the single-step etching time length is closer to the etching incubation time length of SiO$_2$ film than the etching incubation time of SiN film, thereby ensuring the high etching selectivity ratio of SiO$_2$/SiN.

To satisfy the above process requirements in the embodiments of the etching method, the present disclosure provides an etching device for selectively etching the silicon oxide film on the surface of the wafer W that includes the silicon oxide film and the silicon nitride film. As shown FIG. 7, the etching device includes a process chamber 210. The process chamber 210 includes a gas supply unit and a base 240. The gas supply unit includes a gas intake path, a flow equalization chamber 220, and a gas distributor 230 in this order. The gas intake path includes a gas source section and a gas premix section in this order. The gas source section includes a plurality of single-gas sources, which output and supply a plurality of gases respectively. The plurality of gases is premixed in the premix section. Specifically, the gas source section includes a HF gas source 311, a N$_2$ gas source 312, and a NH$_3$ gas source 313. The gas source section further includes a first mass flow controller 321, a second mass flow controller 322, a third mass flow controller 323, and a fourth mass flow controller 324 to control the plurality of single-gas sources. The first mass flow controller 321 controls a gas path of the HF gas source 311. The fourth mass flow controller 324 controls the gas path of the NH$_3$ gas source 313. The N$_2$ gas source 312 includes two gas paths controlled respectively by the second mass flow controller 322 and the third mass flow controller 323. The gas paths respectively controlled by the first mass flow controller 321 and the second mass flow controller 322 merge at a first mixing point 331. The gas paths respectively controlled by the third mass flow controller 323 and the fourth mass flow controller 324 merge at a second mixing point 332. The gas path of the first mixing point 331 and the gas path of the second mixing point 332 merge at a third mixing point 333 and enter the flow equalization chamber 220. The gases are fully mixed in the flow equalization chamber 220. Then, the mixed gas is sprayed onto the to-be-processed surface of the wafer W through the gas distributor 230. The incoming gas is fully mixed in the flow equalization chamber 220 before being sprayed out through the gas distributor 230, thereby effectively increasing the etching efficiency. Through mixing the gases in advance at the mixing points, it can be ensured that the gas flowing out of the gas distributor 230 includes a high concentration of $HN_4F$. Because $HN_4F$ is solid at a low temperature, the gas distributor 230 needs to be heated to above 120° C.

Figure 7:
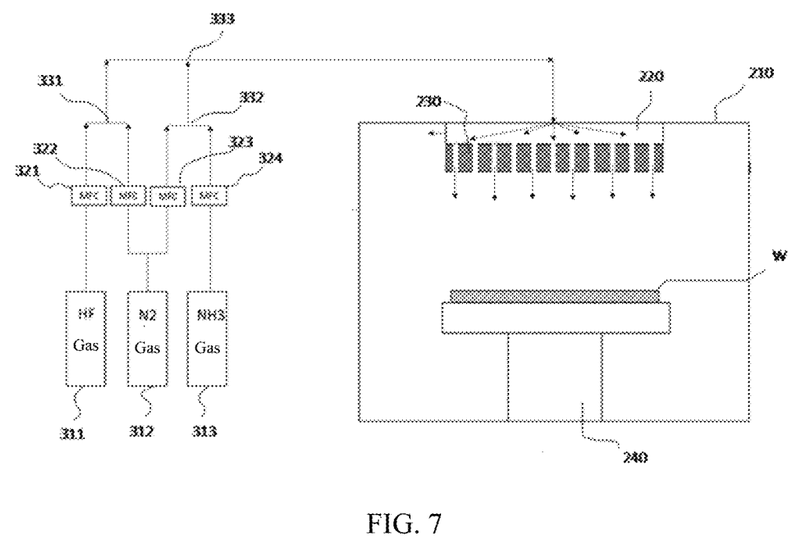
FIG. 7 is a schematic structural diagram of an etching device for implementing an exemplary etching process according to some embodiments of the present disclosure.

In some embodiments, a high-temperature heating device is disposed at the base 240. The temperature at the base 240 is increased to 120° C. or higher to ensure that the solid etching reactants can be quickly sublimed and discharged from the surface of the wafer W and to prevent the solid etching reactants from be attached to the surface of the wafer W. In addition, the base 240 is configured as a liftable base and at the same time, the process chamber 210 is shrunk. Adaptors are eliminated from the process chamber 210. Through coupling of the process chamber 210 and the liftable base 240, a space volume between the surface of the wafer W and the gas distributor 230 is reduced as much as possible. In this way, the etching gas can be quickly removed, excessive staying of the residual etching gas can be avoided, the incubation time length of SiN will not be exceeded, SiN will not be etched, and the improvement of the etching selectivity ratio will not be affected.

In some embodiments, the gas intake path includes the gas source section and the gas premix section in this order. The gas source section includes the plurality of single-gas sources, which output and supply a plurality of gases respectively. The plurality of gases is premixed in the premix section. The mixing of the plurality of gases in the gas premix section further improves mixing effect of the etching gases and the etching efficiency.

In some embodiments, the heating devices are disposed at the gas supply unit and the base, respectively, such that a temperature of the etching process is not lower than 120° C. On one hand, the $HN_4F$ resulted from mixing the etching gases is prevented from being condensed and blocking gas supply paths. On the other hand, the sublimation rate of the etching reactants on the wafer surface can be expedited, and at the same time the etching rate is increased, the reduction of the etching selectivity ratio caused by the deposition of the etching reactants can be avoided.

The present disclosure also provides an air-gap dielectric layer, which is formed by the above-described etching method, such that the air-gap dielectric layer has a high etching selectivity ratio.

The present disclosure also provides a dynamic random-access memory (DRAM), which includes the air-gap dielectric layer, such that the performance of the DRAM can be improved.

In the embodiments of the present disclosure, it should be understood that the disclosed device and method may be implemented in other manners. The device embodiments described above are merely illustrative. If the etching method is implemented in the form of software function modules and sold or used as an independent product, it can be stored in a computer-readable storage medium. Based on such understanding, the technical solution of the present disclosure or some of technical contributions beyond the existing technology can be embodied in the form of a software product. The computer software product may be stored in a storage medium, which includes a plurality of instructions that can be executed by a computer device (e.g., a personal computer, a server, or a networking device, etc.) to perform all or part of the steps of the methods described in various embodiments of the present disclosure. The storage medium includes a USB disk, a portable hard drive, a read-only memory (ROM), a random-access memory (RAM), a magnetic disk, an optical disk, and other media that can store program codes.

EFFECT EXAMPLES

In the following, various examples will be described to illustrate the effects of the present invention.

Example 1

In presence of the surface modification layer, as shown in Table 2, two etching methods were performed on samples c and d respectively for comparison. The surface layer removal process and the etching process were performed on Sample c while only the etching process was performed on Sample d. For the two samples, the etching amounts of $SiO_2$ were substantially the same while the etching amounts of SiN were substantially different. It can be seen that the surface layer removal process significantly improved the etching selectivity ratio. Table 2 illustrates experimental comparison between the etching selectivity ratios of $SiO_2$/SiN for different etching methods.

TABLE 2

| Wafer sample | Etching amount of $SiO_2$ | Etching Amount of SiN | Etching selectivity ratio of $SiO_2$/SiN |
|---|---|---|---|
| c (surface layer removal process + etching process) | 1869.6 | 9.0 | 207.8 |
| d (only etching process) | 1874.5 | 51.0 | 36.6 |

Example 2

As shown in Table 3, different transitions between the surface layer removal process and the etching process are compared. Table 3 illustrates experimental comparison between the etching selectivity ratios of $SiO_2$/SiN for different transitions.

TABLE 3

| Wafer sample | Etching amount of $SiO_2$ | Etching Amount of SiN | Etching selectivity ratio of $SiO_2$/SiN |
|---|---|---|---|
| e (surface layer removal process and etching process are performed separately) | 2277.2 | 10.7 | 229.2 |
| f (surface layer removal process and etching process are performed continuously) | 2445.4 | 117.6 | 19.4 |

It can be seen that, optionally, the surface layer removal process and the etching process could be performed separately. That is, after the surface layer removal process was completed, the wafer needed to be fully heated to remove the etching reactants deposited on the wafer surface before the etching process could be performed subsequently. In general, after the surface layer removal process was completed, the wafer was transferred to the sublimation chamber for sufficient sublimation and discharge before being transferred to the process chamber for performing the etching process. It was not common to perform both the surface layer removal process and the etching process consecutively in the process chamber. The experimental comparison results in Table 3 show that when the surface layer removal process and the etching process were performed separately, a substantial increase of the etching amount of SiN could be avoided, thereby improving the etching selectivity ratio of $SiO_2/SiN$.

Example 3

Figure 8:
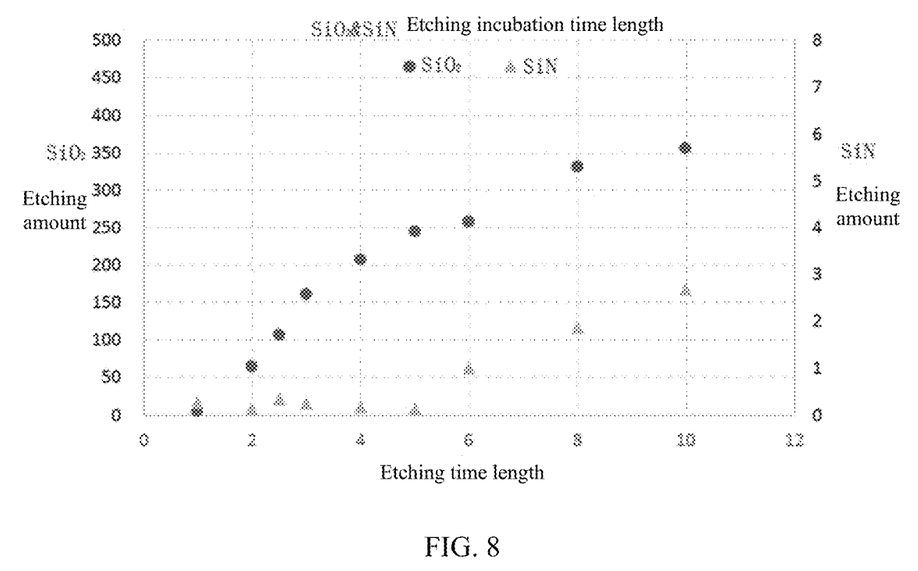
FIG. 8 is a schematic comparison diagram of actual measurements of the etching incubation time of $SiO_2$ and the etching incubation time of SiN using an exemplary etching process according to some embodiments of the present disclosure.

In absence of the surface modification layer, using the above etching method and through the experimental tests, a variation curve of the etching amounts of $SiO_2$ and SiN versus the etching time length was drawn under a certain process condition at the process temperature 120° C., as shown in FIG. 8. It could be seen that, the etching amounts of $SiO_2$ and SiN start to increase substantially around the etching time lengths 1→2 seconds and 5→6 seconds. It could be inferred from this condition that the etching incubation time length of SiN was about 5 to 6 seconds, and the etching incubation time of $SiO_2$ was about 1 to 2 seconds. At the same time, it was tested that the maximum etching amount of $SiO_2$ under the premise that SiN was not etched was about 250 Å. It should be noted that the different process parameters (e.g., pressure, flow rate, temperature, etc.) corresponded to different etching incubation time lengths, and different etching selectivity ratios of $SiO_2/SiN$ achieved by the disclosed etching method. FIG. 8 illustrates the experimental data obtained under the conditions of 120° C., 8 Torr, the HF gas flowing at the flow rate 20 sccm, the $NH_3$ gas flowing at the flow rate 100 sccm, the $N_2$ gas flowing at the flow rate 450 sccm.

In view of the above experimental results, through fine tuning the parameters such as the single-step etching time length and number of etching cycles, under the condition that the etching amount of $SiO_2$ was greater than 1500 Å, the etching selectivity ratio not less than 500:1 could be achieved. In some cases, the etching selectivity ratio reached 1000:1, which was significantly higher than the conventional ammonia gas catalytic process.

As shown in Table 4, it could be concluded that under the condition that the single-step etching time length was not shorter than the etching incubation time length of $SiO_2$ film, the shorter the single-step etching time was, the higher the etching selectivity ratio of $SiO_2/SiN$ was. According to the analysis of present disclosure, under the condition that the single-step etching time length was not shorter than the etching incubation time length of $SiO_2$, the single-step etching time length that was substantially shorter than the etching incubation time length of SiN further avoided a time extension approaching or even exceeding the etching incubation time length of SiN due to untimely and insufficient purging of the etching gas and etching reactants deposited on the surface of the wafer W. Thus, the shorter the single-step etching time length, the more time available for the purging time length. Therefore, before the etching incubation time length of SiN film was approached or exceeded, the etching gas and the etching reactants were completely removed to avoid etching the SiN film. In addition, a long single-step etching time length would cause the etching reactants to adhere and deposit excessively on the surface of the wafer W, making it difficult to vaporize, purge, and remove completely, thereby further absorbing the etching gas and causing the SiN film to be etched.

Therefore, optionally, the single-step etching time length is closer to the etching incubation time length of $SiO_2$ film than the etching incubation time of SiN film, thereby ensuring the high etching selectivity ratio of $SiO_2/SiN$.

Table 4 illustrates experimental comparison of the etching selectivity ratios of $SiO_2/SiN$ for different single-step etching time lengths versus the number of etching cycles.

TABLE 4

| Process | Etching time length | Number of etching cycles | Etching amount of $SiO_2$ | Etching amount of SiN | Etching selectivity ratio of $SiO_2/SiN$ |
|---|---|---|---|---|---|
| 1 | 6 seconds | 180 | 1615.5 | 2.4 | 673.1 |
| 2 | 4 seconds | 320 | 1942.6 | 2.0 | 986.1 |
| 3 | 3 seconds | 300 | 1563.6 | 1.3 | 1193.6 |

Although the present disclosure has been described in detail above with general description and specific embodiments, some modifications or improvements can be made on the basis of the present disclosure, which will be obvious to those skilled in the art. Therefore, these modifications or improvements made without departing from the spirit of the present disclosure fall within the scope of the claimed protection of the present disclosure.

What is claimed is:

1. An etching method for selectively etching a silicon oxide film between a silicon nitride film and the silicon oxide film formed on a wafer surface, comprising:
    a surface layer removal process including: etching the silicon oxide film at a first etching rate and removing a surface modification layer covering on the silicon nitride film; and
    an etching process including: etching the silicon oxide film at a second etching rate, the first etching rate being smaller than the second etching rate.

2. The etching method according to claim 1, wherein the surface layer removal process comprises:
    a first etching step including: using an etching gas to etch the wafer surface at a first pre-determined pressure and within a first etching time length;
    a first purging step including: using a purging gas to purge the wafer surface at a first purging pressure and within a first purging time length; and
    repeating the first etching step and the first purging step until the surface modification layer is removed.

3. The etching method according to claim 2, wherein the etching process comprises:
    a second etching step including: using the etching gas to etch the silicon oxide film at a second pre-determined pressure and within a second etching time length;
    a second purging step including: using the purging gas to purge the wafer surface at a second purging pressure and within a second purging time length; and
    repeating the second etching step and the second purging step until a target etching amount of the silicon oxide film is reached.

4. The etching method according to claim 3, wherein:
    the first pre-determined pressure is smaller than the second pre-determined pressure.

5. The etching method according to claim 4, wherein:
    the first pre-determined pressure is approximately between 1 Torr and 3 Toor; and
    the second pre-determined pressure is approximately between 5 Torr and 10 Torr.

6. The etching method according to claim 3, wherein:
the first etching time length is smaller than the second etching time length.

7. The etching method according to claim 6, wherein:
the first etching time length is approximately between 1 second and 3 seconds; and
the second etching time length is approximately between 1 second and 5 seconds.

8. The etching method according to claim 3, wherein:
the etching gas includes a first component gas and a second component gas; and
the first component gas includes a hydrogen fluoride gas, and the second component gas includes an ammonia gas.

9. The etching method according to claim 8, wherein:
the second purging step further includes using the second component gas to purge the wafer surface at the second purging pressure and within the second purging time length.

10. The etching method according to claim 2, wherein:
the purging gas includes at least one of nitrogen ($N_2$) gas or an inert gas.

11. The etching method according to claim 8, wherein:
in the surface layer removal process, the first component gas is supplied at a first flow rate; and
in the etching process, the first component gas is supplied at a second flow rate, the first flow rate being greater than the second flow rate.

12. The etching method according to claim 1, wherein:
a process temperature of both the surface layer removal process and the etching process is greater than or equal to 120° C.

13. The etching method according to claim 1, further comprising between the surface layer removal process and the etching process:
performing a heating process and a sublimation process on the wafer; and
after the sublimation process, cooling the wafer to a room temperature.

14. The etching method according to claim 13, wherein:
a temperature of the sublimation process is greater than or equal to 180° C.

15. The etching method according to claim 13, further comprising before the etching process:
removing and placing the sublimed and cooled wafer for standing still for a pre-determined time length.

16. The etching method according to claim 2, further comprising before the surface layer removal process:
inspecting a thickness of the surface modification layer on the wafer surface to determine a number of repetitions of the first etching step and the first purging step.

17. The etching method according to claim 3, wherein:
a total gas flow in the second etching step is same as a total gas flow in the second purging step.

18. The etching method according to claim 1, wherein:
the surface modification layer includes at least three elements of silicon, nitrogen, and oxygen.

* * * * *